US012601760B2

(12) United States Patent
Lu et al.

(10) Patent No.: US 12,601,760 B2
(45) Date of Patent: Apr. 14, 2026

(54) PROBE CARD DEVICE AND TUNNEL-TYPE PROBE THEREOF

(71) Applicant: CHUNGHWA PRECISION TEST TECH. CO., LTD., Taoyuan City (TW)

(72) Inventors: Yu-Ju Lu, Taoyuan City (TW); Yi-Hsien Chen, Taoyuan City (TW); Meng-Chieh Cheng, Taipei City (TW); Wei-Jhih Su, Taichung City (TW)

(73) Assignee: CHUNGHWA PRECISION TEST TECH. CO., LTD., Taoyuan City (TW)

( * ) Notice: Subject to any disclaimer, the term of this patent is extended or adjusted under 35 U.S.C. 154(b) by 155 days.

(21) Appl. No.: 18/632,322

(22) Filed: Apr. 11, 2024

(65) Prior Publication Data

US 2024/0377436 A1 Nov. 14, 2024

(30) Foreign Application Priority Data

May 11, 2023 (TW) ................................. 112117435

(51) Int. Cl.
G01R 1/073 (2006.01)
G01R 1/067 (2006.01)

(52) U.S. Cl.
CPC ..... G01R 1/07314 (2013.01); G01R 1/06722 (2013.01); G01R 1/06772 (2013.01)

(58) Field of Classification Search
CPC ............ G01R 1/07314; G01R 1/06722; G01R 1/06772
See application file for complete search history.

(56) References Cited

U.S. PATENT DOCUMENTS

| | | | | | |
|---|---|---|---|---|---|
| 3,676,776 | A | * | 7/1972 | Bauer ................ | G01R 1/07357 |
| | | | | | 324/755.05 |
| 4,200,351 | A | * | 4/1980 | Long .................. | G01R 1/06722 |
| | | | | | 439/824 |
| 5,196,789 | A | * | 3/1993 | Golden .............. | G01R 1/06722 |
| | | | | | 324/755.05 |
| 2021/0048452 | A1 | * | 2/2021 | Yang .................. | G01R 1/06722 |

FOREIGN PATENT DOCUMENTS

CN 218995463 U * 5/2023

OTHER PUBLICATIONS

Deng CN-218995463-U (Year: 2023).*

* cited by examiner

*Primary Examiner* — Paresh Patel
(74) *Attorney, Agent, or Firm* — Li & Cai Intellectual Property Office

(57) ABSTRACT

A tunnel-type probe includes a tube, an elastic member, and a pin. The elastic member is assembled in the tube. The pin is movably disposed through the tube, and is electrically coupled to the tube by being connected to the elastic member. The pin has an inner segment, a contacting segment, and a limiting segment, the latter two of which are connected to two ends of the inner segment. The inner segment is arranged in the tube and is connected to the elastic member. The contacting segment and the limiting segment are respectively located at two opposite sides of the tube. When the tunnel probe abuts against a device under test (DUT) through the contacting segment, the pin is moved in a direction away from the DUT, such that the elastic member is deformed from being pressed by the pin so as to generate an elastic force.

9 Claims, 9 Drawing Sheets

1

PROBE CARD DEVICE AND TUNNEL-TYPE PROBE THEREOF

CROSS-REFERENCE TO RELATED PATENT APPLICATION

This application claims the benefit of priority to Taiwan Patent Application No. 112117435, filed on May 11, 2023. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a probe card, and more particularly to a probe card device and a tunnel-type probe thereof.

BACKGROUND OF THE DISCLOSURE

A conventional pogo pin applied in a probe card has a metal housing and a spring that is assembled and enclosed in the metal housing. Over the years, the conventional pogo pin has gradually been considered to have no more need for improvement in terms of its structural configuration, such that development thereof is largely at a standstill.

SUMMARY OF THE DISCLOSURE

In response to the above-referenced technical inadequacies, the present disclosure provides a probe card device and a tunnel-type probe thereof for effectively improving on the issues associated with conventional pogo pins.

In order to solve the above-mentioned problems, one of the technical aspects adopted by the present disclosure is to provide a probe card device, which includes a first guide plate unit, a second guide plate unit corresponding in position to and spaced apart from the first guide plate unit along a thickness direction, a plurality of conductive probes assembled to the first guide plate unit and the second guide plate unit, and a plurality of tunnel-type probes that are assembled to the first guide plate unit. Each of the conductive probes includes a transmission segment having two end portions respectively arranged in the first guide plate unit and the second guide plate unit, a testing segment extending from one of the two end portions of the transmission segment to protrude out of the first guide plate unit, and a transferring segment extending from another one of the two end portions of the transmission segment to protrude out of the second guide plate unit. Each of the tunnel-type probes includes a tube, an elastic member, and a pin. The tube is inserted into and fixed in the first guide plate unit. The tube has an operation channel, a first opening, and a second opening. The first opening and the second opening are respectively arranged on two opposite ends of the operation channel. The elastic member is assembled to the tube and located in the operation channel. The pin is movably disposed through the operation channel. The pin is connected to the elastic member so as to be electrically coupled to the tube. The pin includes an inner segment, a contacting segment, and a limiting segment. The inner segment is located in the operation channel and is connected to the elastic member. The contacting segment is connected to one end of the inner segment and is located outside of the first opening. The limiting segment is connected to another end of the inner segment. The limiting segment is located outside of the second opening and abuts against the tube. When the pin of each of the tunnel-type probes abuts against a device under test (DUT) through the contacting segment thereof, the pin is moved in a direction away from the DUT, so that a portion of the contacting segment is moved into the operation channel by passing through the first opening, a portion of the inner segment is moved out of the operation channel by passing through the second opening, the limiting segment is separated from the tube, and the elastic member is deformed from being pressed by the pin so as to generate an elastic force.

In order to solve the above-mentioned problems, another one of the technical aspects adopted by the present disclosure is to provide a tunnel-type probe of a probe card device. The tunnel-type probe includes a tube, an elastic member, and a pin. The tube is inserted into and fixed in the first guide plate unit. The tube has an operation channel, a first opening, and a second opening. The first opening and the second opening are respectively arranged on two opposite ends of the operation channel. The elastic member is assembled to the tube and located in the operation channel. The pin is movably disposed through the operation channel. The pin is connected to the elastic member so as to be electrically coupled to the tube. The pin includes an inner segment, a contacting segment, and a limiting segment. The inner segment is located in the operation channel and is connected to the elastic member. The contacting segment is connected to one end of the inner segment and is located outside of the first opening. The limiting segment is connected to another end of the inner segment. The limiting segment is located outside of the second opening and abuts against the tube. When the pin of the tunnel-type probe abuts against a device under test (DUT) through the contacting segment thereof, the pin is moved in a direction away from the DUT, so that a portion of the contacting segment is moved into the operation channel by passing through the first opening, a portion of the inner segment is moved out of the operation channel by passing through the second opening, the limiting segment is separated from the tube, and the elastic member is deformed from being pressed by the pin so as to generate an elastic force.

Therefore, the tunnel-type probe of the present disclosure is provided with a specific structural connection relationship of components thereof (e.g., the pin being movably disposed through the tube), so that the elastic member and the pin can be easily assembled to the tube for reducing the manufacturing difficulty and maintenance complexity of the tunnel-type probe. Specifically, the structural improvement of the tunnel-type probe provided by the present disclosure is based on the operation and configuration of the probe card device, such that the structural improvement does not need to be limited by the structure of pogo pins that are applied in other technical fields.

Moreover, the probe length of the tunnel-type probe in the probe card device provided by the present disclosure is much smaller than the length of the conductive probe, thereby facilitating transmission of signals (e.g., a high-frequency signal, a high-speed signal, or a loop-back signal) that are not suitable to be transmitted by the conductive probe.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
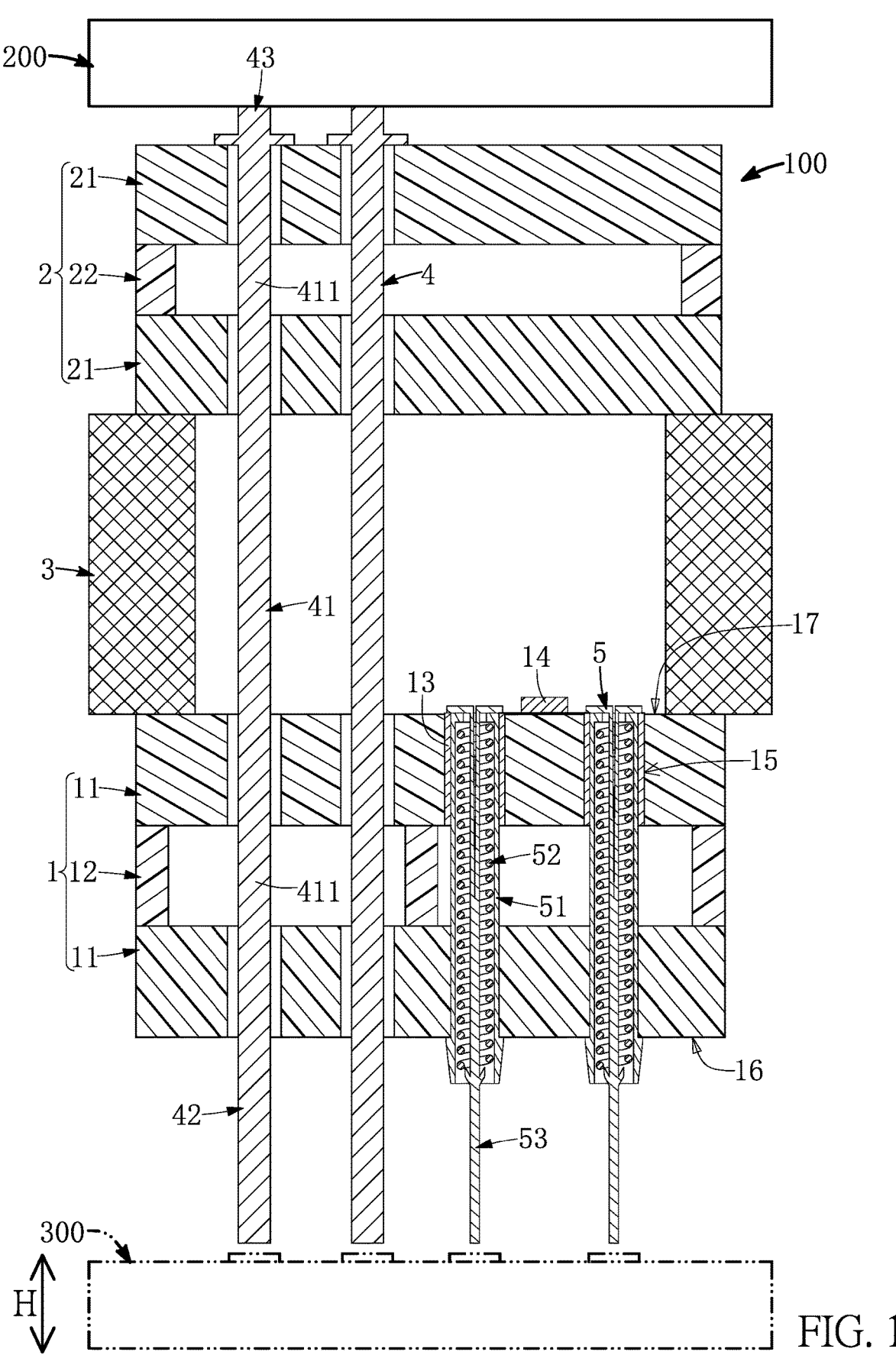
FIG. 1 is a schematic cross-sectional view of a probe card device according to an embodiment of the present disclosure.
Figure 2:
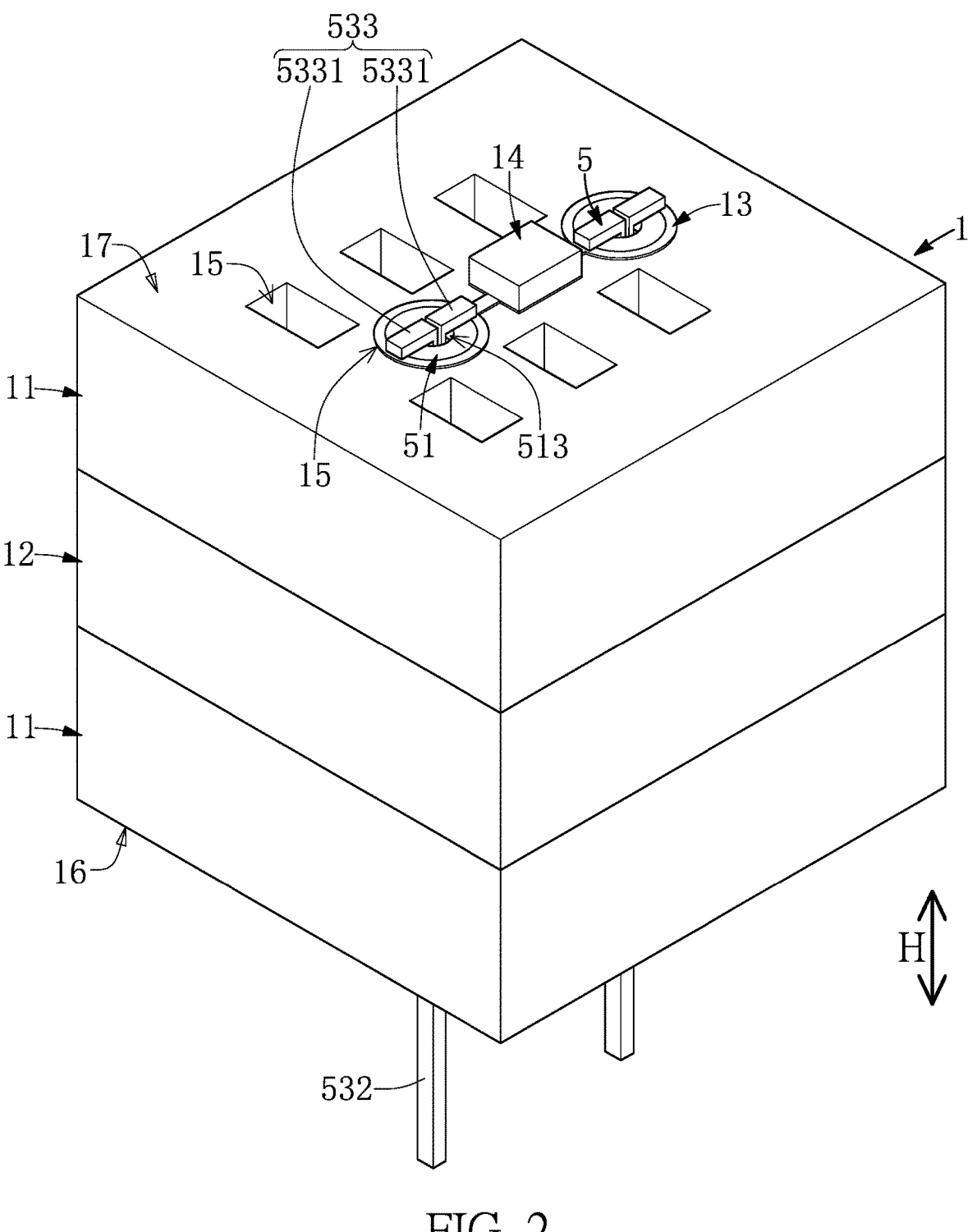
FIG. 2 is a schematic perspective view showing a part of the probe card device according to the embodiment of the present disclosure.
Figure 3:
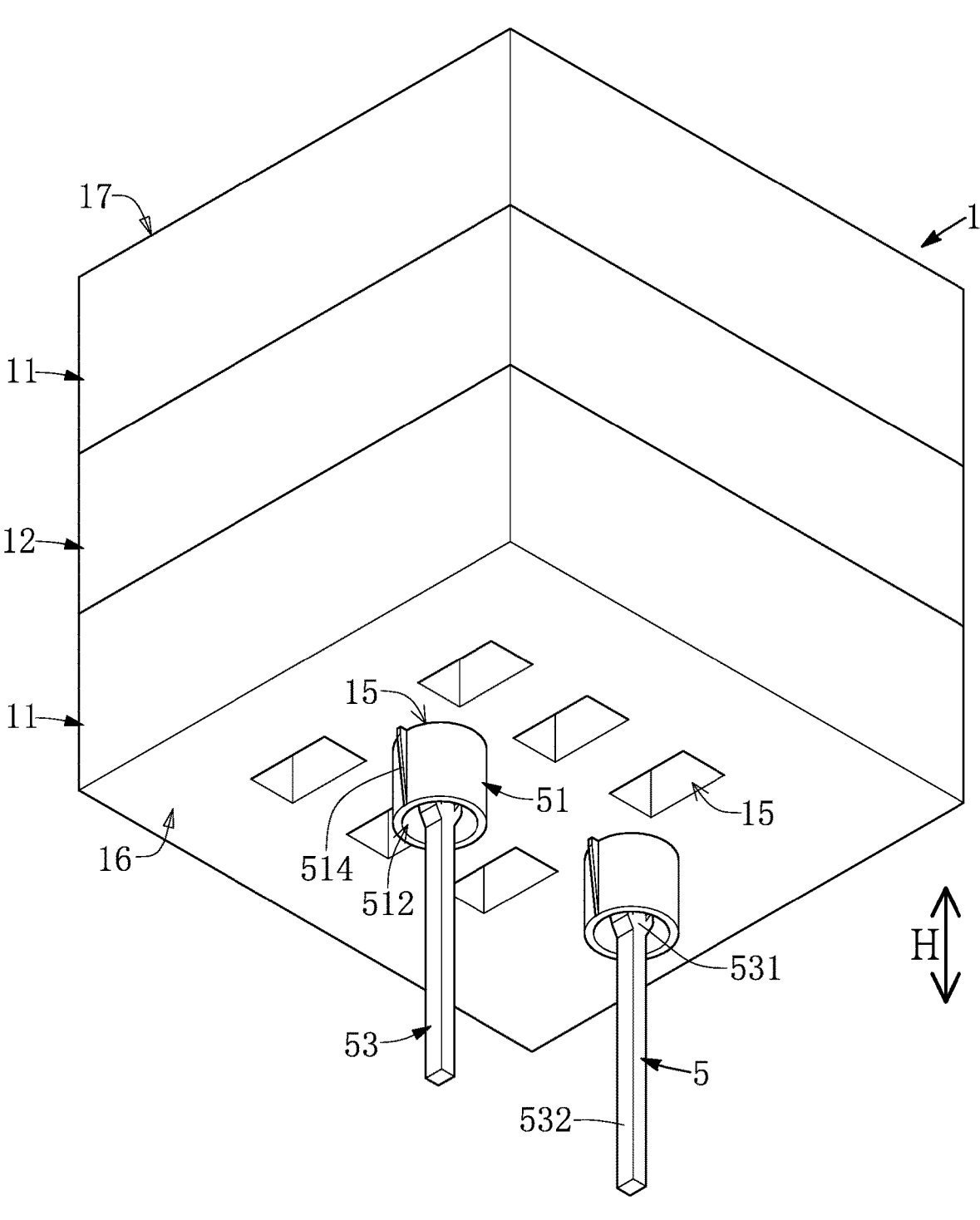
FIG. 3 is a schematic perspective view of FIG. 2 in another angle of view.
Figure 4:
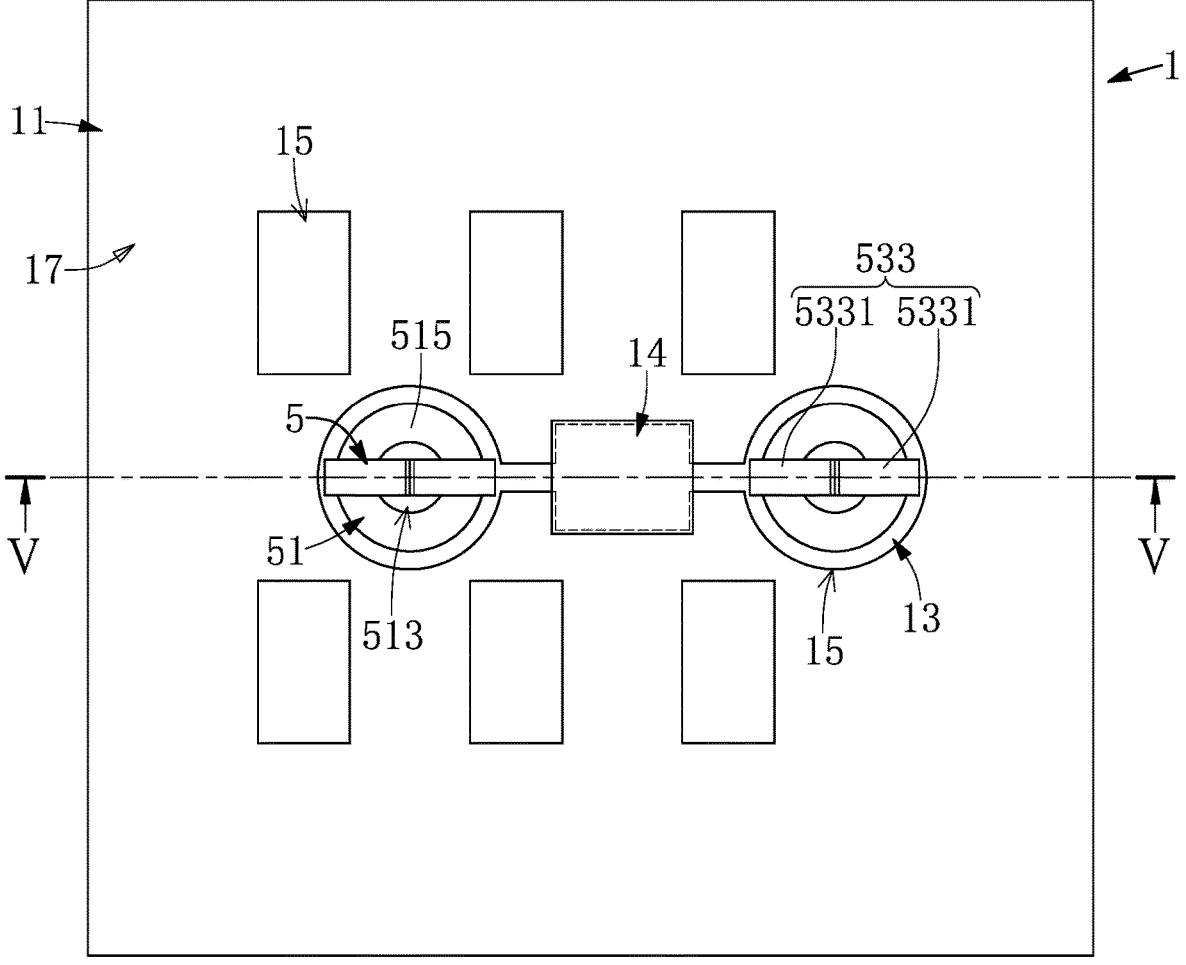
FIG. 4 is a schematic top view of FIG. 2.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

Referring to FIG. 1 to FIG. 9, an embodiment of the present disclosure provides a probe card device 100. As shown in FIG. 1 to FIG. 4, one side of the probe card device 100 is configured to be connected to a space transformer 200, and another side of the probe card device 100 is configured to detachably abut against a device under test (DUT) for testing.

It should be noted that in order to clearly describe the structure and connection relationship of each component of the probe card device 100, the drawings of the present embodiment only show a portion of the probe card device 100. The following description describes the structure and connection relationship of each component of the probe card device 100.

The probe card device 100 includes a first guide plate unit 1, a second guide plate unit 2 corresponding in position to and being spaced apart from the first guide plate unit 1 along a thickness direction H, a spacer 3 sandwiched between the first guide plate unit 1 and the second guide plate unit 2, a plurality of conductive probes 4 assembled to the first guide plate unit 1 and the second guide plate unit 2, and a plurality of tunnel-type probes 5 that are assembled to the first guide plate unit 1.

In addition, the tunnel-type probes 5 in the present embodiment are described in cooperation with the first guide plate unit 1, the second guide plate unit 2, the spacer 3, and the conductive probes 4, but the present disclosure is not limited thereto. For example, in other embodiments of the present disclosure not shown in the drawings, the tunnel-type probe 5 can be independently used (e.g., sold) or can be used in cooperation with other components.

The first guide plate unit 1 in the present embodiment includes two first plates 11 spaced apart from each other along the thickness direction H, a partition plate 12 sandwiched between the two first plates 11, a plurality of transmission circuits 13 formed on at least one of the two first plates 11, and a plurality of electronic components 14 (e.g., passive components such as capacitors or resistors) that are assembled on at least one of the transmission circuits 13, but the present disclosure is not limited thereto. For example, in other embodiments of the present disclosure not shown in the drawings, the first guide plate unit 1 can be a single plate; or, the transmission circuits 13 and/or the electronic components 14 can be omitted according to design requirements; or, the first guide plate unit 1 can have at least one of the transmission circuits 13 (and at least one of the electronic components 14).

In other words, the first guide plate unit 1 has a plurality of thru-holes 15 each extending along the thickness direction H, and at least one of the transmission circuits 13 is formed on a board surface of one of the two first plates 11 and further extends to inner walls of two of the thru-holes 15. Moreover, the electronic components 14 can be disposed on portions of the first guide plate unit 1 not having the thru-holes 15, so that the electronic components 14 and the thru-holes 15 in the present embodiment are staggered with each other.

Moreover, the second guide plate unit 2 includes two second plates 21 spaced apart from each other and a spacing sheet 22 that is sandwiched between peripheral portions of the two second plates 21. In addition, the spacer 3 can be an annular structure sandwiched between peripheral portions of the first guide plate unit 1 and the second guide plate unit 2, but the present disclosure is not limited thereto. For example, in other embodiments of the present disclosure not shown in the drawings, the spacer 3 of the probe card device 100 can be omitted or can be replaced by other components.

As the conductive probes 4 in the present embodiment are of substantially the same structure, the following description discloses the structure of just one of the conductive probes 4 for the sake of brevity, but the present disclosure is not limited thereto. For example, in other embodiments of the present disclosure not shown in the drawings, the conductive probes 4 of the probe card device 100 can be of different structures.

The conductive probe 4 in the present embodiment is integrally formed as a single one-piece structure, and includes a transmission segment 41, a testing segment 42, and a transferring segment 43, the latter two of which extend from the transmission segment 41. Two end portions 411 of the transmission segment 41 are respectively arranged in the first guide plate unit 1 and the second guide plate unit 2, and the first guide plate unit 1 and the second guide plate unit 2 are staggered with each other, so that the transmission segment 41 is elastically bent for being capable of absorbing an external force and providing a stroke.

Moreover, the testing segment 42 extends from one of the two end portions 411 of the transmission segment 41 to protrude out of the first guide plate unit 1, and the two first plates 11 of the first guide plate unit 1 can be staggered with each other for holding the end portion 411 connected to the testing segment 42, thereby enabling the testing segment 42 to be as parallel to the thickness direction H as possible.

In addition, the transferring segment 43 extends from another one of the two end portions 411 of the transmission segment 31 to protrude out of the second guide plate unit 2, and the two second plates 21 of the second guide plate unit 2 can be slightly staggered with each other for holding the end portion 411 connected to the transferring segment 43, thereby controlling a swing direction of the transferring segment 43 (or thereby enabling the transferring segment 43 to be as parallel to the thickness direction H as possible). The transferring segment 43 of each of the conductive probes 4 is connected to the space transformer 200.

Furthermore, as the tunnel-type probes 5 in the present embodiment are of substantially the same structure, the following description discloses the structure of just one of the tunnel-type probes 5 for the sake of brevity, but the present disclosure is not limited thereto. For example, in other embodiments of the present disclosure not shown in the drawings, the tunnel-type probes 5 of the probe card device 100 can be of different structures.

As shown in FIG. 5 to FIG. 8, the tunnel-type probe 5 in the present embodiment is a structure formed by assembling three components, and includes a tube 51, an elastic member 52 assembled in the tube 51, and a pin 53 that is assembled to the tube 51 through the elastic member 52. Each of the tube 51, the elastic member 52, and the pin 53 is integrally formed as a single one-piece structure and has an electrically conductive property, but the present disclosure is not limited thereto.

Moreover, a probe length of the tunnel-type probe 5 can be less than 1 mm and can be less than 60% of a length of the conductive probe 4, thereby facilitating transmission of signal (e.g., a high-frequency signal, a high-speed signal, or a loop-back signal) that is not suitable to be transmitted by the conductive probe 4.

The tube 51 has an operation channel 511, a first opening 512, and a second opening 513, the latter two of which are respectively arranged on two opposite ends of the operation channel 511. The operation channel 511 is formed by penetrating from the first opening 512 to the second opening 513 along the thickness direction H, and an inner diameter of the second opening 513 is less than an inner diameter of the first opening 512.

Moreover, the tube 51 of the tunnel-type probe 5 is inserted into and fixed in the first guide plate unit 1 (e.g., the tube 51 is fixed in the first guide plate unit 1 in an interference-fit manner), one end of the tube 51 having the first opening 512 protrudes from (or is located outside of) the first guide plate unit 1, and another end of the tube 51 having the second opening 513 is coplanar with the first guide plate unit 1.

In the present embodiment, the tube 51 is a substantially round tube, and the tube 51 has two outer ribs 514 arranged outside of and around the first opening 512. In other words, the two outer ribs 514 are protrusions arranged on an outer side of the tube 51, one end of each of the two outer ribs 514 is flush with the first opening 512, and another end of each of the two outer ribs 514 is arranged adjacent to or abuts against an outer surface 16 of the first guide plate unit 1. Moreover, the tube 51 has an inner annular rib 515 defining the second opening 513. The inner annular rib 515 is coplanar with an inner surface 17 of the first guide plate unit 1 (that faces toward the second guide plate unit 2 and that is arranged away from the outer surface 16 of the first guide plate unit 1). However, the present disclosure is not limited by the above description. For example, in other embodiments of the present disclosure not shown in the drawings, a quantity of the outer ribs 514 of the tube 51 can be at least one.

Specifically, the tunnel-type probe 5 is fixed to the two first plates 11 in an interference-fit manner through two portions of the tube 51, and at least two of the tunnel-type probes 5 are connected to at least one of the transmission circuits 13 through the tubes 51 thereof so as to be electrically coupled to each other. In the present embodiment, any two of the tunnel-type probes 5 are electrically coupled to each other by using the tubes 51 to abut against portions of the transmission circuit 13 arranged in the corresponding thru-holes 15.

The elastic member 52 in the present embodiment is a compression spring, but the present disclosure is not limited thereto. One end of the elastic member 52 abuts against the inner annular rib 515 of the tube 51 and is arranged in the operation channel 511. In other words, the elastic member 52 of the present embodiment is limited by the inner annular rib 515, so that the elastic member 52 cannot protrude from the operation channel 511 (or the second opening 513) along the thickness direction H.

The pin 53 is elongated and is movably disposed through the operation channel 511 along the thickness direction H, and the pin 53 is connected to the elastic member 52 so as to be electrically coupled to the tube 51. Accordingly, the tunnel-type probe 5 of the present embodiment is provided with a specific structural connection relationship of components thereof (e.g., the pin 53 being movably disposed through the tube 51), so that the elastic member 52 and the pin 53 can be easily assembled to the tube 51 for reducing the manufacturing difficulty and maintenance complexity of the tunnel-type probe 5.

The pin 53 has an inner segment 531 located in the operation channel 511, a contacting segment 532 connected to one end of the inner segment 531, and a limiting segment 533 that is connected to another end of the inner segment 531. Specifically, the pin 53 is electrically coupled to the tube 51 by using the inner segment 531 to connect to the elastic member 52. In the present embodiment, the inner segment 531 is disposed through the elastic member 52 along the thickness direction H, the one end of the inner segment 531 has a holding structure 5311 (e.g., two ribs) arranged adjacent to the first opening 512, and the contacting segment 532 is connected to the holding structure 5311. The holding structure 5311 is connected and fixed to the elastic member 52, so that the elastic member 52 and the pin 53 (e.g., the inner segment 531) can be simultaneously moved.

Moreover, the contacting segment 532 extends along the thickness direction H from the inner segment 531 to protrude from the operation channel 511, so that the contacting segment 532 is located outside of the first opening 512. The limiting segment 533 extends along the thickness direction H from the inner segment 531 to protrude from the operation channel 511, so that the limiting segment 533 is located outside of the second opening 513 and abuts against the tube 51.

The elastic member 52 is sandwiched between the holding structure 5311 of the inner segment 531 and an inner wall of the tube 51 (e.g., the inner annular rib 515) along the thickness direction H for generating a preloaded force, so that the limiting segment 533 is maintained to abut against the tube 51 (e.g., an outer side of the inner annular rib 515) through the preloaded force of the elastic member 52. It should be noted that the limiting segment 533 in the present embodiment simultaneously abuts against the tube 51 and the first guide plate unit 1 (e.g., the inner surface 17), but the present disclosure is not limited thereto.

Specifically, the limiting segment 533 includes two limiting blocks 5331 being separate from each other, and the inner segment 531 includes two branched arms 5312 and a connection arm 5313. The two branched arms 5312 and the connection arm 5313 are disposed through the elastic member 52. Moreover, one end of the connection arm 5313 is connected to the holding structure 5311 and the contacting segment 532, and the two branched arms 5312 spaced apart from each other and extend from another end of the connection arm 5313 to respectively be connected to the two limiting blocks 5331. In the present embodiment, the two branched arms 5312 can abut against the elastic member 52 by being spaced apart from each other, each of the two branched arms 5312 is substantially and perpendicularly connected to a corresponding one of the two limiting blocks 5331, and the two limiting blocks 5331 are spaced apart from each other along a straight direction and cross slightly over the tube 51 along a radial direction of the tube 51, but the present disclosure is not limited thereto.

Figure 5:
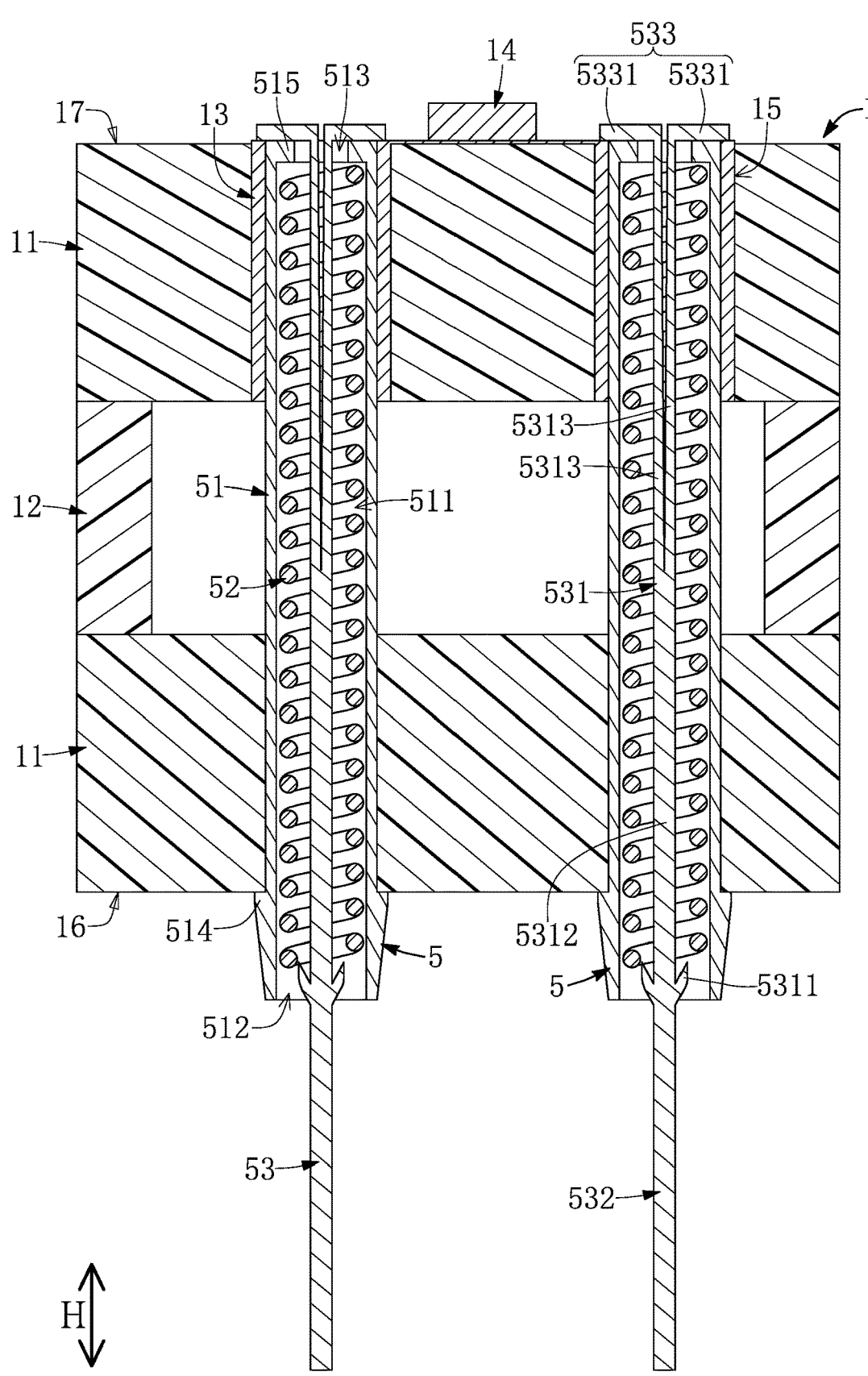
FIG. 5 is a schematic cross-sectional view taken along line V-V of FIG. 4.
Figure 6:
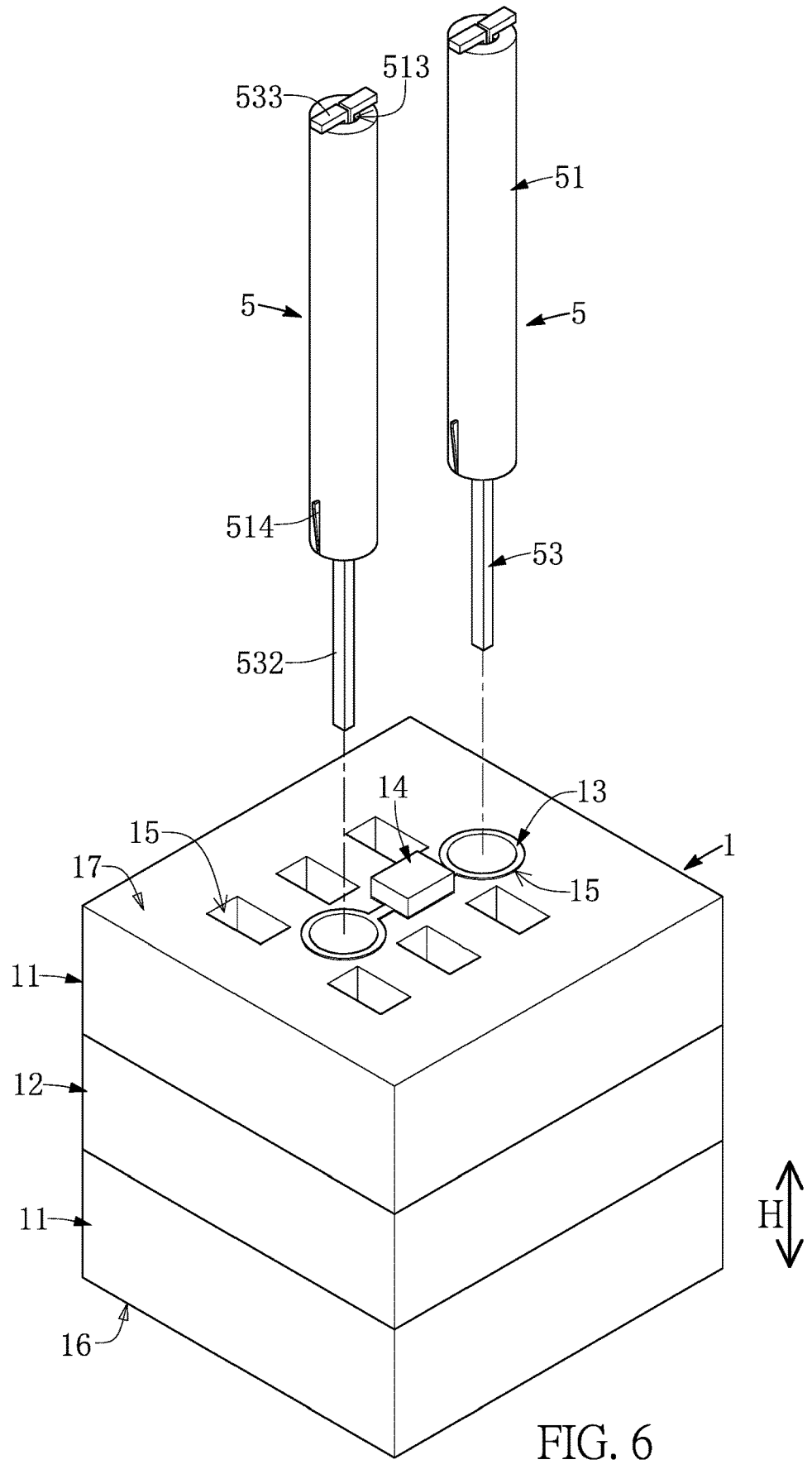
FIG. 6 is a schematic exploded view of FIG. 2.
Figure 7:
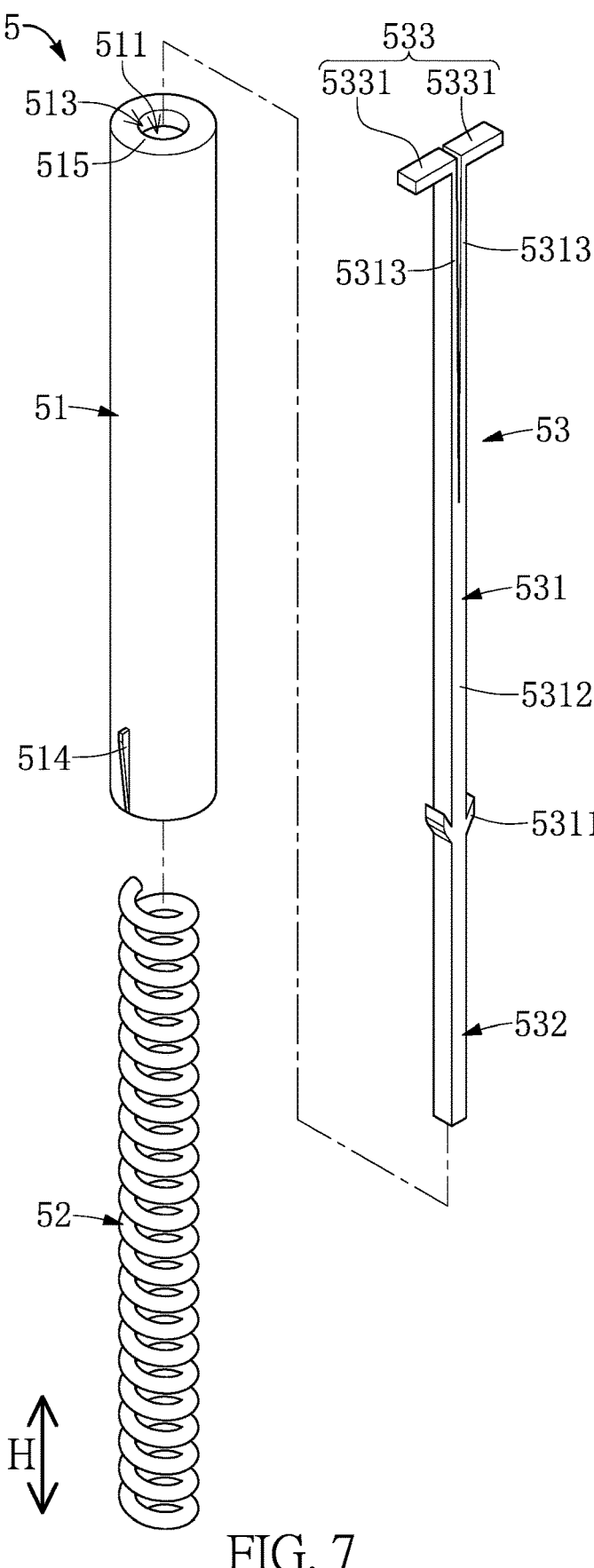
FIG. 7 is a schematic exploded view of a tunnel-type probe according to the embodiment of the present disclosure.
Figure 8:
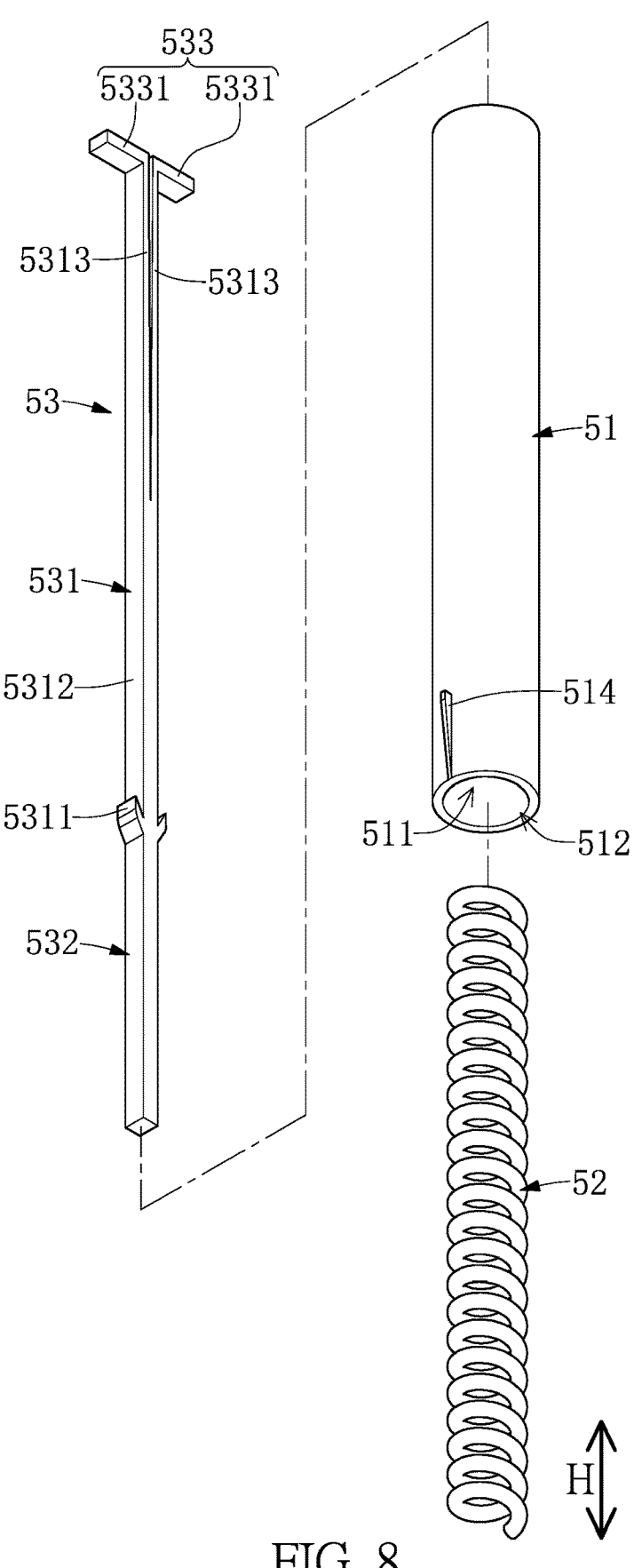
FIG. 8 is a schematic exploded view of the tunnel-type probe in another angle of view according to the embodiment of the present disclosure.
Figure 9:
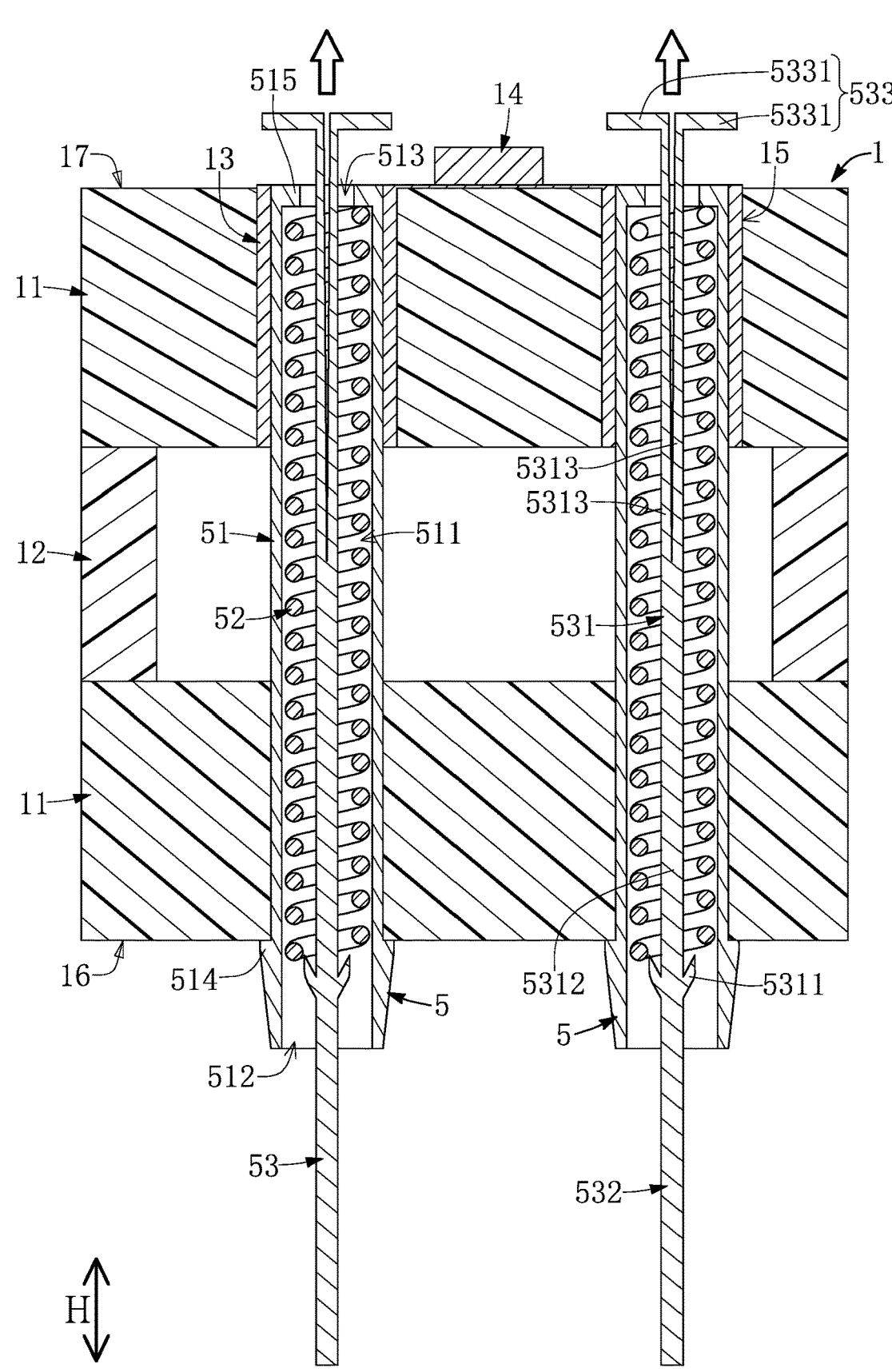
FIG. 9 is a schematic cross-sectional view showing the tunnel-type probe of FIG. 5 in operation.

In summary, as shown in FIG. 1, FIG. 5, and FIG. 9, when the pin 53 of each of the tunnel-type probes 5 abuts against the DUT 300 through the contacting segment 532 thereof, the pin 53 is moved in a direction away from the DUT 300, so that a portion of the contacting segment 532 is moved into the operation channel 511 by passing through the first opening 512, a portion of the inner segment 531 is moved out of the operation channel 511 by passing through the second opening 513, the limiting segment 533 is separated from the tube 51 (and the first guide plate unit 1), and the elastic member 52 is deformed from being pressed by the pin 53 so as to generate an elastic force that is greater than the preloaded force.

Accordingly, the pin 53 of the tunnel-type probe 5 in the present embodiment can be moved in a space located outside of the first guide plate unit 1 by being cooperated with the tube 51 that has a specific structural design, so that a movement of the pin 53 is not limited by the first guide plate unit 1.

Beneficial Effects of the Embodiment

In conclusion, the tunnel-type probe of the present disclosure is provided with a specific structural connection relationship of components thereof (e.g., the pin being movably disposed through the tube), so that the elastic member and the pin can be easily assembled to the tube for reducing the manufacturing difficulty and maintenance complexity of the tunnel-type probe. Specifically, the structural improvement of the tunnel-type probe provided by the present disclosure is based on the operation and configuration of the probe card device, such that the structural improvement does not need to be limited by the structure of pogo pins that are applied in other technical fields.

Moreover, the probe length of the tunnel-type probe in the probe card device provided by the present disclosure is much smaller than the length of the conductive probe, thereby facilitating transmission of signals (e.g., a high-frequency signal, a high-speed signal, or a loop-back signal) that are not suitable to be transmitted by the conductive probe.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A probe card device, comprising:
a first guide plate unit;
a second guide plate unit corresponding in position to and being spaced apart from the first guide plate unit along a thickness direction;
a plurality of conductive probes assembled to the first guide plate unit and the second guide plate unit, wherein each of the conductive probes includes:
a transmission segment having two end portions respectively arranged in the first guide plate unit and the second guide plate unit;
a testing segment that extends from one of the two end portions of the transmission segment to protrude out of the first guide plate unit; and
a transferring segment that extends from another one of the two end portions of the transmission segment to protrude out of the second guide plate unit; and
a plurality of tunnel-type probes assembled to the first guide plate unit, wherein each of the tunnel-type probes includes:
a tube inserted into and fixed in the first guide plate unit, wherein the tube has an operation channel, a first opening, and a second opening, and wherein the first opening and the second opening are respectively arranged on two opposite ends of the operation channel;
an elastic member assembled to the tube and located in the operation channel; and a pin movably disposed through the operation channel, wherein the pin is connected to the elastic member so as to be electrically coupled to the tube, and the pin includes:

an inner segment located in the operation channel and connected to the elastic member;

a contacting segment connected to one end of the inner segment and located outside of the first opening; and a limiting segment connected to another end of the inner segment, wherein the limiting segment is located outside of the second opening and abuts against the tube;

wherein, when the pin of each of the tunnel-type probes abuts against a device under test (DUT) through the contacting segment thereof, the pin is moved in a direction away from the DUT, so that a portion of the contacting segment is moved into the operation channel by passing through the first opening, a portion of the inner segment is moved out of the operation channel by passing through the second opening, the limiting segment is separated from the tube, and the elastic member is deformed from being pressed by the pin so as to generate an elastic force;

wherein, in each of the tunnel-type probes, the limiting segment includes two limiting blocks being separate from each other, and the inner segment includes two branched arms that are disposed through the elastic member and that are respectively connected to the two limiting blocks.

2. The probe card device according to claim 1, wherein, in each of the tunnel-type probes, the inner segment is disposed through the elastic member, and the one end of the inner segment has a holding structure; and wherein, in each of the tunnel-type probes, the elastic member is sandwiched between the holding structure of the inner segment and an inner wall of the tube for generating a preloaded force that is smaller than the elastic force, so that the limiting segment is maintained to abut against the tube through the preloaded force.

3. The probe card device according to claim 2, wherein, in each of the tunnel-type probes, the holding structure is arranged adjacent to the first opening, and the contacting segment is connected to the holding structure.

4. The probe card device according to claim 2, wherein, in each of the tunnel-type probes, the tube has an inner annular rib defining the second opening; and wherein, in each of the tunnel-type probes, the inner annular rib is coplanar with an inner surface of the first guide plate unit that faces toward the second guide plate unit, and the elastic member is sandwiched between the holding structure and the inner annular rib.

5. The probe card device according to claim 4, wherein, in each of the tunnel-type probes, the tube has at least one outer rib that is arranged around the first opening and that abuts against an outer surface of the first guide plate unit arranged away from the inner surface.

6. The probe card device according to claim 1, wherein, in each of the tunnel-type probes, the limiting segment simultaneously abuts against the tube and the first guide plate unit, so that when the pin abuts against the DUT through the contacting segment, the limiting segment is separated from the tube and the first guide plate unit.

7. The probe card device according to claim 1, wherein the first guide plate unit includes at least one transmission circuit and at least one electronic component that is connected to the at least one transmission circuit, and the tubes of at least two of the tunnel-type probes are connected to the at least one transmission circuit so as to be electrically coupled to each other.

8. A tunnel-type probe of a probe card device, comprising:

a tube having an operation channel, a first opening, and a second opening, wherein the first opening and the second opening are respectively arranged on two opposite ends of the operation channel;

an elastic member assembled to the tube and located in the operation channel; and a pin movably disposed through the operation channel, wherein the pin is connected to the elastic member so as to be electrically coupled to the tube, and the pin includes:

an inner segment located in the operation channel and connected to the elastic member;

a contacting segment connected to one end of the inner segment and located outside of the first opening; and a limiting segment connected to another end of the inner segment, wherein the limiting segment is located outside of the second opening and abuts against the tube;

wherein, when the pin of the tunnel-type probe abuts against a device under test (DUT) through the contacting segment thereof, the pin is moved in a direction away from the DUT, so that a portion of the contacting segment is moved into the operation channel by passing through the first opening, a portion of the inner segment is moved out of the operation channel by passing through the second opening, the limiting segment is separated from the tube, and the elastic member is deformed from being pressed by the pin so as to generate an elastic force;

wherein, the limiting segment includes two limiting blocks being separate from each other, and the inner segment includes two branched arms that are disposed through the elastic member and that are respectively connected to the two limiting blocks.

9. The tunnel-type probe according to claim 8, wherein the tube has at least one outer rib arranged around the first opening and an inner annular rib that defines the second opening, wherein the at least one outer rib is configured to abut against an outer surface of a first guide plate unit, the inner segment is disposed through the elastic member, and the one end of the inner segment has a holding structure, and wherein the elastic member is sandwiched between the holding structure of the inner segment and the inner annular rib of the tube for generating a preloaded force that is smaller than the elastic force, so that the limiting segment is maintained to abut against the tube through the preloaded force.

* * * * *